United States Patent
Su

(10) Patent No.: US 11,543,104 B2
(45) Date of Patent: Jan. 3, 2023

(54) RCLED LAMP BEAD PACKAGING PROCESS AND RCLED LAMP BEAD PACKAGED BY THE SAME

(71) Applicant: PSG Opto Development Co., Ltd, Guangdong (CN)

(72) Inventor: San Su, Guangdong (CN)

(73) Assignee: PSG OPTO DEVELOPMENT CO., LTD., Guangdong (CN)

( * ) Notice: Subject to any disclaimer, the term of this patent is extended or adjusted under 35 U.S.C. 154(b) by 0 days.

(21) Appl. No.: 17/741,367

(22) Filed: May 10, 2022

(65) Prior Publication Data

US 2022/0364710 A1   Nov. 17, 2022

(30) Foreign Application Priority Data

May 12, 2021   (CN) .......................... 202110515367.7

(51) Int. Cl.
  *F21V 19/00*   (2006.01)
  *F21K 9/60*   (2016.01)
  (Continued)

(52) U.S. Cl.
  CPC ............ *F21V 19/0025* (2013.01); *F21K 9/60* (2016.08); *F21K 9/90* (2013.01); *F21V 23/002* (2013.01); *G02B 1/11* (2013.01); *F21Y 2115/10* (2016.08)

(58) Field of Classification Search
  CPC ...... F21V 19/0025; F21V 23/002; F21K 9/60; F21K 9/90; G02B 1/11; F21Y 2115/10
  See application file for complete search history.

(56) References Cited

U.S. PATENT DOCUMENTS

| | | | |
|---|---|---|---|
| 7,268,368 B1* | 9/2007 | Knapp | G02B 6/423 257/E31.118 |
| 2007/0012940 A1 | 1/2007 | Suh et al. | |
| 2008/0230796 A1 | 9/2008 | Ho et al. | |

FOREIGN PATENT DOCUMENTS

| | | |
|---|---|---|
| CN | 103000781 A | 3/2013 |
| CN | 105609602 A | 5/2016 |

(Continued)

OTHER PUBLICATIONS

English Translation of WO2019028961A1; Led display screen, display device and display system; Chow (Year: 2019).*

(Continued)

*Primary Examiner* — Jong-Suk (James) Lee
*Assistant Examiner* — Glenn Zimmerman
(74) *Attorney, Agent, or Firm* — Muncy, Geissler, Olds & Lowe, P.C.

(57) ABSTRACT

Disclosed are RCLED lamp bead packaging process and RCLED lamp bead, which comprises steps of: dispensing a die-bonding glue, mounting a chip, baking, welding a bonding wire, dispensing a first layer of anti-reflection adhesive, baking, dispensing a second layer of anti-reflection adhesive, baking, and testing. Anti-reflection adhesive is dispensed in corresponding area to cover part capable of reflecting light in RCLED lamp bead and eliminate reflection effect effectively. The first layer of anti-reflection adhesive fills in specified area rapidly to achieve high production efficiency. The second layer of anti-reflection adhesive flows slowly after glue dispensing, so that the glue dispensing precision is improved and the light-emitting hole is prevent from being covered. When bonding wire is welded, a bracket is the first welding spot and a PAD of the chip is the second welding spot to achieve a lower radian of the bonding wire.

12 Claims, 1 Drawing Sheet

(51) Int. Cl.
*F21V 23/00* (2015.01)
*G02B 1/11* (2015.01)
*F21K 9/90* (2016.01)
*F21Y 115/10* (2016.01)

(56) References Cited

FOREIGN PATENT DOCUMENTS

| | | | | |
|---|---|---|---|---|
| CN | 105957928 A | 9/2016 | | |
| CN | 208368541 U | * 1/2019 | ........... | H01L 33/483 |
| CN | 110277477 A | 9/2019 | | |
| CN | 110649141 A | 1/2020 | | |
| CN | 210516749 U | 5/2020 | | |
| CN | 111628066 A | * 9/2020 | ............. | H01L 33/48 |
| CN | 111628066 A | 9/2020 | | |
| KR | 20190119438 A | 10/2019 | | |
| WO | WO-2019028961 A1 | * 2/2019 | ......... | G02B 27/2228 |

OTHER PUBLICATIONS

English Translation of CN-111628066-A; Process method for improving LED brightness; Li (Year: 2020).*

English Translation of CN-208368541U; High-efficiency-enhancing CSP LED; Kang (Year: 2019).*

* cited by examiner

RCLED LAMP BEAD PACKAGING PROCESS AND RCLED LAMP BEAD PACKAGED BY THE SAME

CROSS REFERENCE TO RELATED APPLICATIONS

This patent application claims priority of Chinese Patent Application No. 202110515367.7 filed on May 12, 2021, the disclosure of which is incorporated by reference herein in its entirety as part of the present application.

FIELD OF THE INVENTION

The present application relates to the technical field of lamp bead packaging, in particular to a RCLED lamp bead packaging process and a RCLED lamp bead packaged by the same.

BACKGROUND

A RCLED, or a Resonant Cavity Light Emitting Diode, is a new type of light emitting diode structure, having both advantages of the traditional LED and the vertical cavity surface emitting laser (VCSEL). Through an action of the microcavity effect, the mode of a spontaneous radiation in a source area is changed, further a frequency and an angle of the radiation spectrum is limited, which is able to greatly improve internal and external quantum efficiency, to provide an excellent structure for preparing an LED having a high brightness.

Due to a plurality of advantages of the RCLED, in fields including sighting telescope and more, the RCLED is usually applied as an emission light source. However, when light emitted from the RCLED passes through lens, there is a part of the light being reflected by the lens, and a light spot reflected back by the lens will be reflected again by a functional area and a bonding wire in a RCLED lamp bead, affecting a light spot emitted by the RCLED, which may form a photospheric facula or a ghost, and seriously affect an overall effect of the light spot.

A traditional LED lamp bead packaging process cannot eliminate the reflection effect hereinabove. Therefore, it is necessary to propose a new RCLED lamp bead packaging process, to eliminate the reflection effect of the RCLED lamp beads, and further to solve an influence of the photospheric facula or the ghosting on the light spot, so as to improve an effect of the RCLED lamp beads emitting the light spots, and make the light spots clearer and more accurate.

Therefore, the current technology needs to be improved and developed.

BRIEF SUMMARY OF THE APPLICATION

According to the defects in the prior art described above, the present application provides a RCLED lamp bead packaging process and a RCLED lamp bead packaged by the same, to eliminate the reflection effect of the RCLED lamp beads, and further to solve the influence of the photospheric facula or the ghosting on the light spot, so as to improve the effect of the RCLED lamp beads emitting the light spots, and make the light spots clearer and more accurate.

The technical solution of the present application to solve the technical problems is as follows:

A RCLED lamp bead packaging process, which includes steps:

Step 1, dispensing a die-bonding glue into a designated position of a lamp bead bracket, the lamp bead bracket comprises a wire frame;

Step 2, mounting a RCLED chip into a glue dispensing area of the lamp bead bracket, and the RCLED chip comprises a light-emitting hole and a PAD;

Step 3, baking to solidify the die-bonding glue, and the die-bonding glue combines with a plurality of pins of the RCLED chip tightly to fix the RCLED chip;

Step 4, welding a bonding wire to connect the lamp bead bracket to the PAD;

Step 5, dispensing a first layer of anti-reflection adhesive on a bottom of the lamp bead bracket, covering a functional area, instead of covering a front face of the RCLED chip and a light-emitting hole of the RCLED chip;

Step 6, placing the RCLED lamp bead having the first layer of anti-reflection adhesive dispensed into an oven for baking, and solidifying the first layer of anti-reflection adhesive;

Step 7, dispensing a second layer of anti-reflection adhesive to cover the bonding wire and the PAD, but not cover the light-emitting hole;

Step 8, placing the RCLED lamp bead having the second layer of anti-reflection adhesive dispensed into an oven for baking, and solidifying the second layer of anti-reflection adhesive;

Step 9, placing the RCLED lamp bead having been packaged on a test platform before performing a test on an illumination and reflection effect.

Further, in the step 1 the die-bonding glue is a silver glue.

Further, in the step 4, when welding the bonding wire, the wire frame is a first solder joint, and the PAD of the RCLED chip is a second solder joint, making a radian of the bonding wire lower.

Further, in the step 5, wherein a viscosity of the first layer of anti-reflection adhesive is 100-500 CP.

Further, in the step 6, wherein a baking temperature for the first layer of anti-reflection adhesive is 120-180° C.

Further, in the step 6, wherein a baking time for the first layer of anti-reflection adhesive is 90-130 minutes.

Further, in the step 7, wherein a viscosity of the second layer of anti-reflection adhesive is 15000-25000 CP.

Further, in the step 7, wherein the second layer of anti-reflection adhesive and the first layer of anti-reflection adhesive are a same glue, having a black color.

Further, in the step 7, wherein a baking temperature for the second layer of anti-reflection adhesive is 110-160° C.

Further, in the step 7, wherein a baking time for the second layer of anti-reflection adhesive is 70-120 minutes.

Further, in the step 5 and the step 7, wherein when dispensing the first layer of anti-reflection adhesive and the second layer of anti-reflection adhesive, a volumetric dispensing valve is adopted to achieve a precise control of a dispensing quantity.

Comparing to the prior art, the present application has following benefits:

The present application proposes a RCLED lamp bead packaging process, by dispensing the anti-reflection adhesive in a corresponding area of the RCLED lamp bead, a part of the RCLED lamp bead being able to make a reflection is covered, the reflective effect of the RCLED lamp bead is eliminated effectively, and an effect of the RCLED lamp bead emitting the light spots is improved, making the light spots clearer and more precise;

The present application proposes a RCLED lamp bead packaging process, the viscosity of the first layer of anti-reflection adhesive has a certain fluidity, being able to make the anti-reflection adhesive fill in the designated area quickly, having a production efficiency high;

The present application proposes a RCLED lamp bead packaging process, the viscosity of the second layer of anti-reflection adhesive is relatively high, flowing slowly after being dispensed, thus a dispensing precise is improved, being able to prevent the anti-reflection adhesive from covering the light-emitting hole of the RCLED chip effectively;

The present application proposes a RCLED lamp bead packaging process, when welding the bonding wire, the wire frame is the first solder joint, and the PAD of the RCLED chip is the second solder joint, making the radian of the bonding wire lower, which can reduce a thickness of the anti-reflection adhesive effectively, making the lamp bead have a good shape, while reducing an amount of an adhesive being dispensed, and saving a production cost, also, due to the thickness of the anti-reflection adhesive is small, a blocking to the light-emitting hole of the RCLED chip by the anti-reflection adhesive will be further avoided.

The present application further proposes a RCLED lamp bead packaged by the process described above, which comprises:

A lamp bead bracket;
A RCLED chip located in the lamp bead bracket;
A PAD arranged on the RCLED chip;
A bonding wire with one end welding with the PAD;
A wire frame arranged on the lamp bead bracket and welded with another end of the bonding wire to achieve a low radian of the bonding wire;
A first layer of anti-reflection adhesive arranged on a bottom of the lamp bead bracket to cover a functional area;
A second layer of anti-reflection adhesive covering the bonding wire and the PAD; and
A light-emitting hole located on the RCLED chip without being covered by the first layer of anti-reflection adhesive and the second layer of anti-reflection adhesive.

Figure 1:
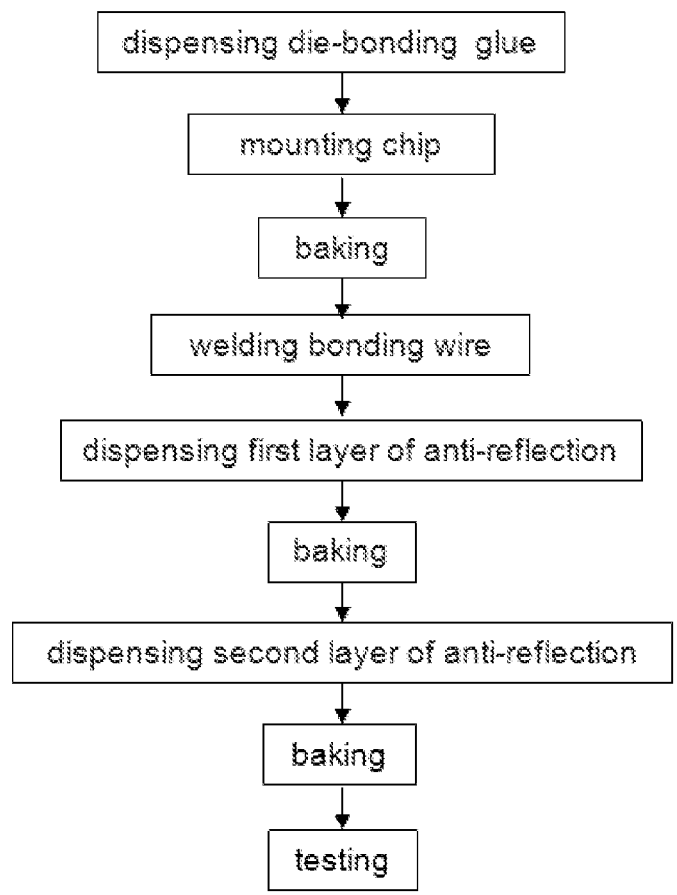
FIG. 1 illustrates a flow chart of an RCLED lamp bead packaging process provided by the present application.
Figure 2:
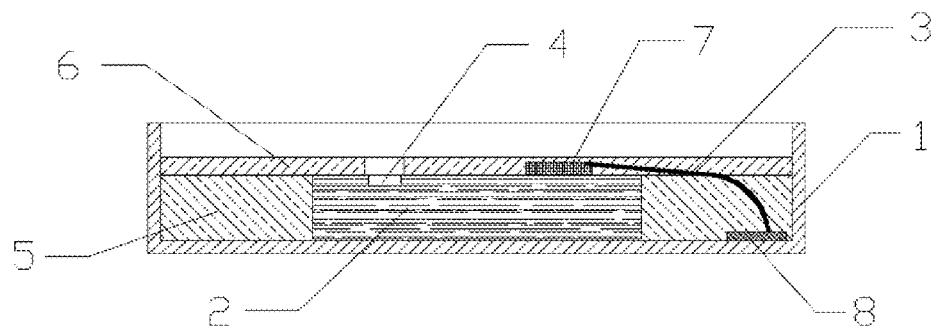
FIG. 2 illustrates a cross-sectional view of a RCLED lamp bead structure in the RCLED lamp bead packaging process provided by the present application.

Wherein: 1. lamp bead bracket, 2. RCLED chip, 3. bonding wire, 4. light-emitting hole, 5. first layer of anti-reflection adhesive, 6. second layer of anti-reflection adhesive, 7. PAD, 8. wire frame.

DETAILED DESCRIPTION OF EMBODIMENTS

In order to make the purpose, technical solution and the advantages of the present application clearer and more explicit, further detailed descriptions of the present application are stated herein, referencing to the attached drawings and some embodiments of the present application. It should be understood that the detailed embodiments of the application described here are used to explain the present application only, instead of limiting the present application.

It should be noted that the terms "first", "second" and a plurality of similar expressions used herein are only for a purpose of illustration, instead of representing an only embodiment.

A RCLED lamp bead packaging process, which comprises following steps:

Step 1, dispensing a die-bonding glue into a designated position of a lamp bead bracket 1, the lamp bead bracket 1 comprises a wire frame 8;

Step 2, mounting a RCLED chip 2 into a glue dispensing area of the lamp bead bracket 1, and the RCLED chip 2 comprises a light-emitting hole 4 and a PAD 7;

Step 3, baking to solidify the die-bonding glue, and the die-bonding glue combines with a plurality of pins of the RCLED chip 2 tightly to fix the RCLED chip 2;

Step 4, welding a bonding wire 3 to connect the lamp bead bracket 8 to the PAD 7;

Step 5, dispensing a first layer of anti-reflection adhesive 5 on a bottom of the lamp bead bracket 1, covering a functional area, instead of covering a front face of the RCLED chip 2 and a light-emitting hole 4 of the RCLED chip 2;

Step 6, placing the RCLED lamp bead 2 having the first layer of anti-reflection adhesive 5 dispensed into an oven for baking, and solidifying the first layer of anti-reflection adhesive 5;

Step 7, dispensing a second layer of anti-reflection adhesive 6 to cover the bonding wire 3 and the PAD 7, but not cover the light-emitting hole 4;

Step 8, placing the RCLED lamp bead 2 having the second layer of anti-reflection adhesive 6 dispensed into an oven for baking, and solidifying the second layer of anti-reflection adhesive 6;

Step 9, placing the RCLED lamp bead 2 having been packaged on a test platform before performing a test on an illumination and reflection effect.

In the step 1, the die-bonding glue is a silver glue.

In the step 4, when welding the bonding wire 3, the wire frame 8 is a first solder joint, and the PAD 7 of the RCLED chip 2 is a second solder joint, making a radian of the bonding wire 3 lower.

In the step 5, a viscosity of the first layer of anti-reflection adhesive 5 is 100-500 CP.

In the step 6, a baking temperature for the first layer of anti-reflection adhesive 5 is 120-180° C.

In the step 6, a baking time for the first layer of anti-reflection adhesive 5 is 90-130 minutes.

In the step 7, a viscosity of the second layer of anti-reflection adhesive 6 is 15000-25000 CP.

In the step 7, the second layer of anti-reflection adhesive 6 and the first layer of anti-reflection adhesive 5 are a same glue, having a color of black.

In the step 7, a baking temperature for the second layer of anti-reflection adhesive 6 is 110-160° C.

In the step 7, a baking time for the second layer of anti-reflection adhesive 6 is 70-120 minutes.

In the step 5 and the step 7, when dispensing the first layer of anti-reflection adhesive 5 and the second layer of anti-reflection adhesive 6, a volumetric dispensing valve is adopted to control a precise control of a dispensing quantity.

The present application proposes a RCLED lamp bead packaging process, by dispensing the anti-reflection adhesive in a corresponding area of the RCLED lamp bead 2, a part of the RCLED lamp bead 2 being able to make a reflection is covered, the reflective effect of the RCLED lamp bead 2 is eliminated effectively, and an effect of the RCLED lamp bead 2 emitting the light spots is improved, making the light spots clearer and more precise. When welding the bonding wire 3, the wire frame 8 is a first solder joint, and the PAD 7 of the RCLED chip 2 is a second solder joint, making the radian of the bonding wire 3 lower, which can reduce a thickness of the anti-reflection adhesive effectively, making the lamp bead have a good shape, while reducing an amount of the adhesive being dispensed, and saving a production cost, and also, due to the thickness of the anti-reflection adhesive is small, it is able to avoid the anti-reflection adhesive from blocking the light-emitting hole 4 of the RCLED chip 2. When dispensing the first layer of anti-reflection adhesive 5, an amount of the adhesive being dispensed is precisely controlled through a volumetric dispensing valve, when the viscosity is 100-500 CP, the first layer of anti-reflection adhesive 5 has a good fluidity, being able to fill a designated area with a natural flow quickly. When dispensing the second layer of anti-reflection adhesive 6, an amount of the adhesive being dispensed is controlled precisely through a volumetric dispensing valve, when the viscosity is 15000-25000 CP, the second layer of anti-reflection adhesive 6 has a fluidity poor, being able to ensure that the second layer of anti-reflection adhesive 6 is able to cover the bonding wire and an upper part of the RCLED chip 2, without blocking the light-emitting hole 4.

The present application further proposes a RCLED lamp bead packaged by the process, which comprises:

A lamp bead bracket 1;

A RCLED chip 2 located in the lamp bead bracket 1;

A PAD 7 arranged on the RCLED chip 2;

A bonding wire 3 with one end welding with the PAD 7;

A wire frame 8 arranged on the lamp bead bracket 1 and welded with another end of the bonding wire 3 to achieve a low radian of the bonding wire 3;

A first layer of anti-reflection adhesive 5 arranged on a bottom of the lamp bead bracket 1 to cover a functional area;

A second layer of anti-reflection adhesive 6 covering the bonding wire 3 and the PAD 7; and A light-emitting hole 4 located on the RCLED chip 2, without being covered by the first layer of anti-reflection adhesive 5 and the second layer of anti-reflection adhesive 6.

Those skilled in the art, upon consideration of the specification and practice of the schemes disclosed herein, will think of a plurality of other embodiments of the application without any difficulties. The present application is intended to cover any modifications, uses or adaptations thereof, which follows the general principles of the present application and comprises common knowledge or conventional technical means in the present technical field but not being disclosed in the present solution. The specification and embodiments herein are to be regarded as exemplary only, with the true scope and spirit of the application being indicated by the claims.

What is claimed is:

1. A Resonant Cavity Light Emitting Diode (RCLED) lamp bead packaging process, comprising:
    step 1, dispensing a die-bonding glue into a designated position of a lamp bead bracket, the lamp bead bracket comprises a wire frame;
    step 2, mounting a RCLED chip into a glue dispensing area of the lamp bead bracket, and the RCLED chip comprises a light-emitting hole and a pad;
    step 3, baking to solidify the die-bonding glue, and the die-bonding glue combines with a plurality of pins of the RCLED chip tightly to fix the RCLED chip;
    step 4, welding a bonding wire to connect the lamp bead bracket to the pad;
    step 5, dispensing a first layer of anti-reflection adhesive on a bottom of the lamp bead bracket, covering a functional area, instead of covering a front face of the RCLED chip and the light-emitting hole of the RCLED chip;
    step 6, placing the RCLED lamp bead having the first layer of anti-reflection adhesive dispensed into an oven for baking, and solidifying the first layer of anti-reflection adhesive;
    step 7, dispensing a second layer of anti-reflection adhesive to cover the bonding wire and the pad, but not cover the light-emitting hole;
    step 8, placing the RCLED lamp bead having the second layer of anti-reflection adhesive dispensed into an oven for baking, and solidifying the second layer of anti-reflection adhesive;
    step 9, placing the RCLED lamp bead having been packaged on a test platform before performing a test on an illumination and reflection effect.

2. The packaging process according to claim 1, wherein in the step 1, the die-bonding glue is a silver glue.

3. The packaging process according to claim 1, wherein the step 4 further comprises, when welding the bonding wire, the wire frame is a first solder joint, and the pad of the RCLED chip is a second solder joint, making an angle of the bonding wire lower.

4. The packaging process according to claim 1, wherein in the step 5, a viscosity of the first layer of anti-reflection adhesive is 100-500 CP.

5. The packaging process according to claim 4, wherein in the step 6, a baking temperature for the first layer of anti-reflection adhesive is 120-180° C.

6. The packaging process according to claim 4, wherein in the step 6, a baking time for the first layer of anti-reflection adhesive is 90-130 minutes.

7. The packaging process according to claim 1, wherein in the step 7, a viscosity of the second layer of anti-reflection adhesive is 15000-25000 CP.

8. The packaging process according to claim 7, wherein in the step 7, the second layer of anti-reflection adhesive and the first layer of anti-reflection adhesive are a same glue having a black color.

9. The packaging process according to claim 7, wherein in the step 8, a baking temperature for the second layer of anti-reflection adhesive is 110-160° C.

10. The packaging process according to claim 7, wherein in the step 8, a baking time for the second layer of anti-reflection adhesive is 70-120 minutes.

11. The packaging process according to claim 1, wherein in the step 5 and the step 7, when dispensing the first layer of anti-reflection adhesive and the second layer of anti-reflection adhesive, a volumetric dispensing valve is adopted to achieve a precise control of a dispensing quantity.

12. A RCLED lamp bead packaged by the process according to claim 1, comprising:
    the lamp bead bracket;
    the RCLED chip located in the lamp bead bracket;
    the pad arranged on the RCLED chip;
    the bonding wire with one end welded with the pad;
    the wire frame arranged on the lamp bead bracket and welded with another end of the bonding wire to achieve a low angle of the bonding wire;
    the first layer of anti-reflection adhesive arranged on the bottom of lamp bead bracket to cover the functional area;
    the second layer of anti-reflection adhesive covering the bonding wire and the pad; and
    the light-emitting hole located on the RCLED chip without being covered by the first layer of anti-reflection adhesive and the second layer of anti-reflection adhesive.

* * * * *